United States Patent
Kuczynski et al.

(10) Patent No.: US 10,973,131 B2
(45) Date of Patent: Apr. 6, 2021

(54) METHOD OF MANUFACTURING PRINTED CIRCUIT BOARDS

(71) Applicant: International Business Machines Corporation, Armonk, NY (US)

(72) Inventors: Joseph Kuczynski, North Port, FL (US); Sarah K. Czaplewski-Campbell, Rochester, MN (US); Timothy J. Tofil, Rochester, MN (US); Eric J. Campbell, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 290 days.

(21) Appl. No.: 16/027,069

(22) Filed: Jul. 3, 2018

(65) Prior Publication Data

US 2020/0015362 A1 Jan. 9, 2020

(51) Int. Cl.
*H05K 3/10* (2006.01)
*H05K 3/40* (2006.01)
*H05K 3/42* (2006.01)

(52) U.S. Cl.
CPC .......... *H05K 3/4046* (2013.01); *H05K 3/423* (2013.01); *H05K 2203/0723* (2013.01); *H05K 2203/1105* (2013.01); *H05K 2203/1131* (2013.01); *H05K 2203/122* (2013.01)

(58) Field of Classification Search
CPC .... H05K 3/4046; H05K 3/4053; H05K 3/423; H05K 2203/0723; H05K 2203/122; H05K 2203/1105; H05K 2203/1131; H05K 1/0251; H05K 1/0298
See application file for complete search history.

(56) References Cited

U.S. PATENT DOCUMENTS

| | | | |
|---|---|---|---|
| 7,279,064 B2* | 10/2007 | Daniel | G02F 1/1679 156/295 |
| 7,583,430 B2* | 9/2009 | Daniel | G02F 1/133377 359/296 |
| 8,222,537 B2 | 7/2012 | Dudnikov, Jr. et al. | |
| 8,528,203 B2 | 9/2013 | Balcome et al. | |
| 9,763,327 B2 | 9/2017 | Pen et al. | |
| 2007/0062730 A1 | 3/2007 | Murry | |
| 2007/0246252 A1 | 10/2007 | Buchwalter et al. | |
| 2012/0211273 A1 | 8/2012 | Kuczynski et al. | |
| 2012/0234587 A1 | 9/2012 | Nakamura et al. | |
| 2014/0262455 A1 | 9/2014 | Iketani et al. | |
| 2015/0147486 A1 | 5/2015 | Abed et al. | |

(Continued)

OTHER PUBLICATIONS

U.S. Appl. No. 15/823,025, filed Nov. 27, 2017.

(Continued)

*Primary Examiner* — Paul D Kim
(74) *Attorney, Agent, or Firm* — Patterson + Sheridan, LLP

(57) ABSTRACT

In an embodiment, a method of forming a stub-less via is provided. The method includes depositing a plurality of microcapsules containing a metal material in a via of a printed circuit board (PCB); rupturing the microcapsules and releasing the metal material; and sintering the metal material. In another embodiment, a method of forming a stub-less via is provided. The method includes forming a via in a printed circuit board (PCB); installing a plug in a portion of the via; depositing in the via a plurality of nanoparticles containing a metal material; and sintering the metal material.

16 Claims, 5 Drawing Sheets

(56) References Cited

U.S. PATENT DOCUMENTS

2015/0201504 A1    7/2015  Yaniv et al.
2017/0271173 A1    9/2017  Ho

OTHER PUBLICATIONS

Su et al., "Design and construction of microcapsules containing rejuvenator for asphalt", Powder Technology 235 pp. 563-571 (2013).
Zenou et al., "Laser sintering of copper nanoparticles", J. Phys. D: Appl. Phys. 47 (2014) 025501 (11pp). doi:10.1088/0022-3727/47/2/025501.
Ryu et al., "Reactive Sintering of Copper Nanoparticles Using Intense Pulsed Light for Printed Electronics", Journal of Electronic Materials, vol. 40, No. 1, pp. 42-50 (2011).
U.S. Appl. No. 15/655,257, filed Jul. 20, 2017.
U.S. Appl. No. 15/231,515, filed Aug. 8, 2016.
U.S. Appl. No. 15/819,289, filed Nov. 21, 2017.

\* cited by examiner

METHOD OF MANUFACTURING PRINTED CIRCUIT BOARDS

BACKGROUND

The present disclosure relates to the manufacture of printed circuit boards (PCBs), and more specifically, to the creation of contact vias in PCBs and other substrates, such as interconnect substrates. Vias are typically formed in a PCB by drilling a hole through part or all of the board. A conductive material is then plated into the via to line the walls of the via, thus electrically connecting conductive structures at different levels in the PCB. These vias are commonly called "plated through holes" (PTHs). Often, it is desired to plate only a portion of the hole to reach a particular conductive structure in the PCB, but plating processes are not location selective so the entire hole is plated, resulting in a "via stub," which is a plated portion of the via beyond that which is desired to be plated. Typically, the via stub is a portion of the PTH from one surface of the PCB to the conductive structure that was to be reached by plating the PTH.

Via stubs can create severe distortions in high speed digital signals passing through the via. The signal travels down the via, reaching the conductive trace, but also travels down the via stub to the end thereof, reflecting back along the via to create a ghost signal at the conductive trace. The via stub can be eliminated through costly and time-consuming processes of "backdrilling," or drilling out the unwanted plating material. Other techniques to reduce via stubs are the use of micro vias, build up layers, and conductive joining layers. However, these techniques are complex and time-consuming processes There is a need in the art for improved methods of making stub-less vias in PCBs and other substrates, such as interconnect substrates.

SUMMARY

In an embodiment, a method of forming a stub-less via is provided. The method includes depositing a plurality of microcapsules containing a metal material in a via of a printed circuit board (PCB); rupturing the microcapsules and releasing the metal material; and sintering the metal material.

In another embodiment, a method of forming a stub-less via is provided. The method includes forming a via in a printed circuit board (PCB); installing a plug in a portion of the via; depositing in the via a plurality of microcapsules containing a metal material; rupturing the microcapsules and releasing the metal material; sintering the metal material; masking the PCB with a patterned mask; and electroplating a non-masked via.

In another embodiment, a method of forming a stub-less via is provided. The method includes forming a via in a printed circuit board (PCB); installing a plug in a portion of the via; depositing in the via a plurality of nanoparticles containing a metal material; and sintering the metal material.

BRIEF DESCRIPTION OF THE SEVERAL VIEWS OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to improved methods of making stub-less vias in PCBs (a/k/a printed wiring boards or printed wiring cards) and other substrates, such as interconnect substrates. Embodiments of the present disclosure further show a method of forming controlled depth PTH connections. Embodiments of a method entail the use of an encapsulated metal material (e.g., Cu or Cu alloy) in a microcapsule with a shell that ruptures leaving behind the metal material. The method includes the operations of: plugging the back side of the PTHs using existing art at a desired depth to eliminate the stub; depositing microcapsules containing a metal material in the PTH; heating to rupture the shell; and laser sintering the metal material to create a "bulk metal material" in the PTH. The laser sintering may be accomplished by techniques known in the art. Embodiments described herein eliminate the need for backdrilling after via plating.

In other embodiments, a method entails the use of nanoparticles containing a metal material without the use of a microcapsule. The method includes the operations of: plugging the back side of the PTHs using existing art at a desired depth to eliminate the stub; depositing nanoparticles containing a metal material in the PTH; and laser sintering the metal material to create a "bulk metal material" in the PTH. The laser sintering may be accomplished by techniques known in the art.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s).

While this disclosure refers to metal "nanoparticles," it will be appreciated that the following disclosure may be applied to particles having a large size (e.g., "microparticles"). While this disclosure refers to "microcapsules," it will be appreciated that the following disclosure may be applied to capsules having a smaller size (e.g., "nanocapsules").

Figure 1A:
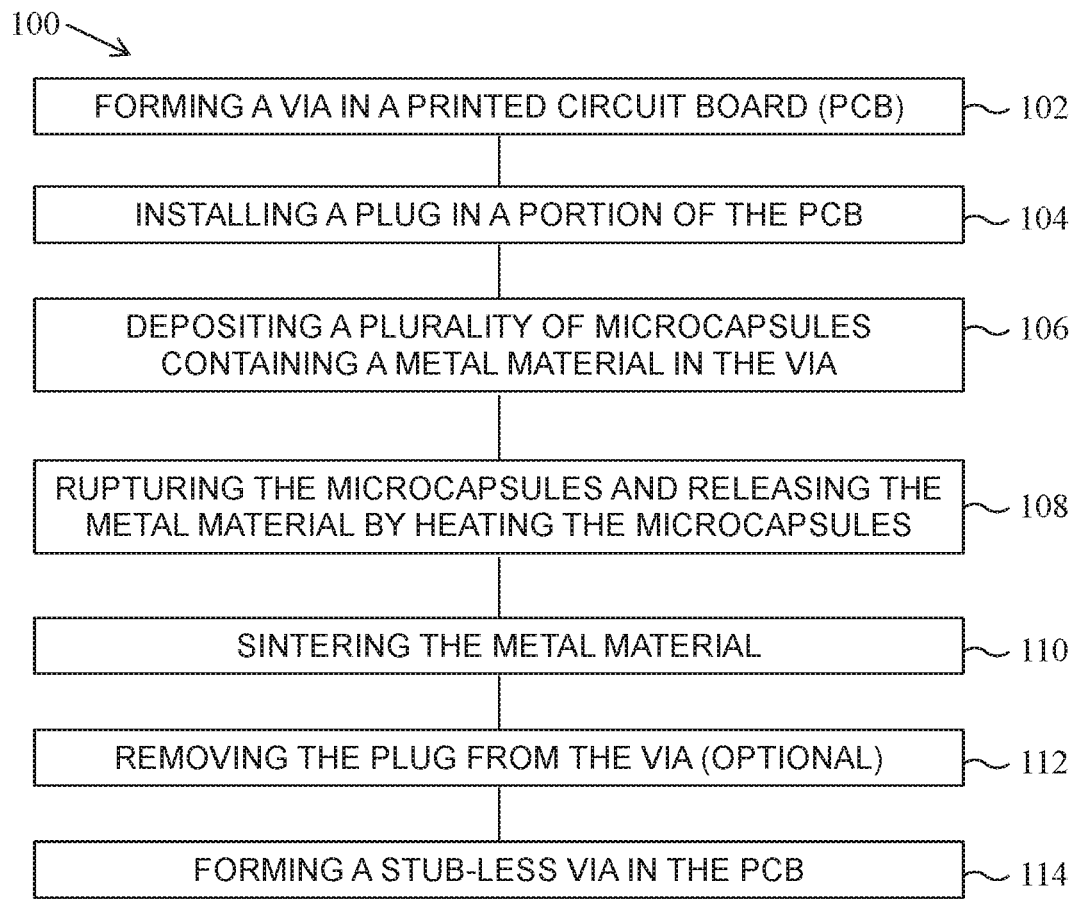
FIG. 1A is a flow diagram summarizing a method of forming a stub-less via according to some embodiments.
Figure 2A:
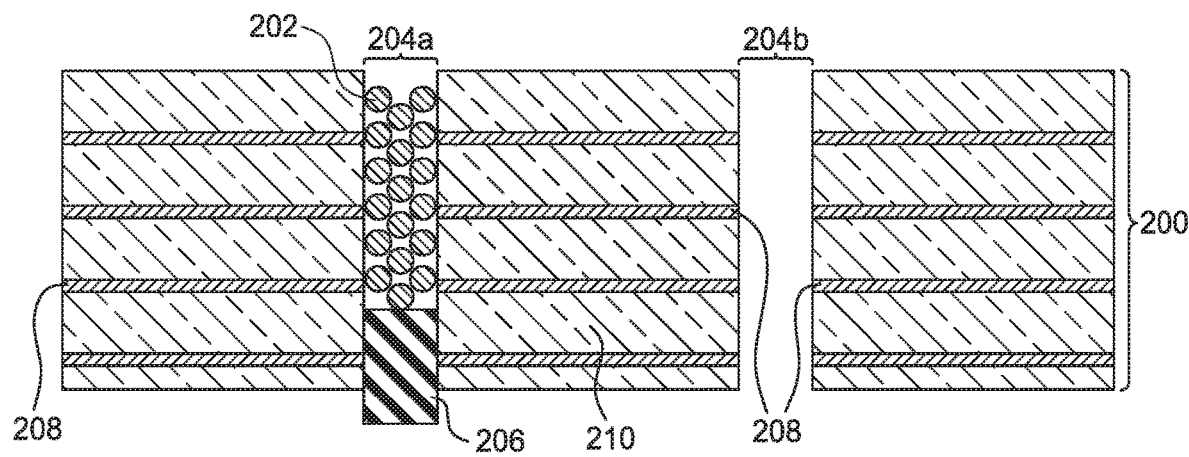
FIGS. 2A-2D are schematic cross-sectional views of a PCB at various stages of the method of FIGS. 1A and 1B.

FIG. 1A is a flow diagram summarizing a method 100 of forming a stub-less via in a PCB according to some embodiments. The method 100 is a method of forming a partially plated through-hole to a predetermined depth in a PCB. Method 100 includes forming a via in a PCB at operation 102. The via is formed in the PCB according to any convenient means of forming such a via, for example, by laser drilling and/or mechanical drilling. The via is formed at a location intended to contact a conductive structure (e.g., a circuit trace) in the PCB for electrically connecting the conductive structure to another conductive structure at another location in the PCB. As shown in FIG. 2A, vias 204a and 204b expose one or more internal structures such as the circuit traces 208 of the PCB 200.

Method 100 includes installing a plug (or cap) in a portion of the via at operation 104. The plug is installed according to any convenient means known in the art of installing such a plug to a desired depth, such as by using an arrayed tool. The plug acts to control where the laser sintering occurs in the via and the PCB. The plug may be any plug known in the art for plugging PCB vias, for example a vinyl or silicone rubber plug. For example, the plug can be a cylindrical plug. As shown in FIG. 2A, plug 206 is installed in the via 204a requiring a controlled depth.

Method 100 includes depositing a plurality of microcapsules containing a metal material in the via at operation 106. Examples of metal material are a copper (Cu) material and a copper alloy material. The metal material may be solids such as nanoparticles. The microcapsules may be prepared by several techniques known in the art such as pan coating, spray drying, centrifugal extrusion, and emulsion-based methods. An example of an emulsion-based method to form microcapsules containing the metal material is coacervation. Microencapsulation by coacervation involves three main operations, which may be performed according to the following process. (1) Phase separation of the coating polymer solution: Styrenemaleic anhydride (SMA, 10.0 g), a surfactant such as nonylphenol ethoxylate (NP-10, 0.2 g), and a metal material (e.g., copper nanoparticles) are added to water (100 ml) at about 50° C. to form a mixture. The amount of copper nanoparticles can be empirically determined based on the application. For example, the amount of nanoparticles can be about 10 g. The mixture is allowed to stir at about 50° C. for about 2 hours. The pH of the mixture is adjusted to a pH of about 4-5 by dropwise addition of aqueous sodium hydroxide (10%). The mixture is emulsified mechanically under a vigorous stirring rate of from about 500 revolutions per minute (rpm) to about 4,000 rpm for about 10 minutes using a high speed disperse machine to form an emulsion. (2) Adsorption of the coacervation around the core particles: the encapsulation is carried out in a 500 ml three-neck round-bottomed flask equipped with a condenser and a mechanical stirrer. The above emulsion is transferred to the flask which is dipped in a steady temperature flume. To the emulsion is added dropwise a methanol-melamine-formaldehyde (MMF) prepolymer (32 g) with various dropping speeds under a stirring rate of about 500 rpm to form a reaction mixture. After about 1 hour, the temperature of the reaction mixture is increased to about 80° C. to promote polymerization. (3) Solidification of the microcapsules: after polymerization for about 2 hours, the temperature of the reaction mixture is decreased slowly at a rate of about 2° C./min to about atmospheric temperature (which is between about 15° C. and about 25° C.). The resultant microcapsules are then filtered and washed with water and dried in a vacuum oven. This process results in the microcapsules containing a metal material.

In an embodiment, and as described above, the shell wall of the microcapsule is formed from an MMF prepolymer. The MMF prepolymer forms a shell wall of melamine-formaldehyde.

Alternately, the shell wall of the microcapsule can be formed from any heat-sensitive polymer, such as polymers that rupture at temperatures above normal storage conditions for the microcapsules, e.g., at about 60° C. As an example, poly-ε-caprolactone melts at about 60° C. As another example, the shell wall may be formed from polymers that melt at a temperature greater than about 90° C., such as N-isopropylacrylamide (N-IPAAm) (melting point of about 96° C.). As another example, the shell wall may be formed from polymers that melt at a temperature greater than about 150° C., such as poly lactic acid (melting point of about 160° C.). The upper temperature limit at which the shell wall ruptures is determined by the application. For example, when the microcapsules are used with a laminate material, the upper temperature limit at which the shell wall ruptures is about 300° C.

The melting point of polymers can be tailored for the specific application. N-IPAAm contracts upon heating to initiate thermal release because it undergoes a reversible lower critical solution temperature phase transition. The temperature at which the phase transition occurs can be altered by tailoring the polymer structure. N-IPAAm microcapsule shells can also rupture from increased internal pressure upon contraction of the shell due to temperature increase. Examples of heat-sensitive polymers that can be used to form the shell wall of the microcapsules include gelatin, arabic gum, shellac, lac, starch, dextrin, wax, rosin, sodium alginate, zein, methyl cellulose, ethyl cellulose, carboxymethyl cellulose, hydroxyethyl ethyl cellulose, polyolefins, polystyrenes, polyethers, polyesters, polyureas, polyethylene glycol, polyamides, polyimides, urea-formaldehydes, polyurethane, polyacrylate, epoxy resins, and combinations thereof.

Method 100 includes rupturing the microcapsules and releasing the metal material by heating the microcapsules at operation 108. The shell wall of the microcapsules contains a heat-sensitive polymer which ruptures upon heating the microcapsules at a predetermined temperature. Heating of the microcapsule causes rupturing of the shell wall by, for example, melting of the shell wall, changes in porosity of the shell wall, and/or disintegration of the shell wall. Rupturing of the shell wall results in the metal material being released from the microcapsule in the via.

The PCB can be heated globally or locally depending on the location of the PTHs to a temperature sufficient to rupture the shell wall, for example, to a temperature of greater that storage conditions of the microcapsules, such as greater than about room temperature, such as greater than about 60° C., such as greater than about 90° C. The upper temperature limit at which the shell wall ruptures is determined by the application. For example, when the microcapsules are used with a laminate material, the upper temperature limit at which the shell wall ruptures is about 300° C. Global heating can be performed by placing the PCB in an oven or on a heated plate. Local heating can be performed by heating with a laser or a heat gun.

Figure 2B:
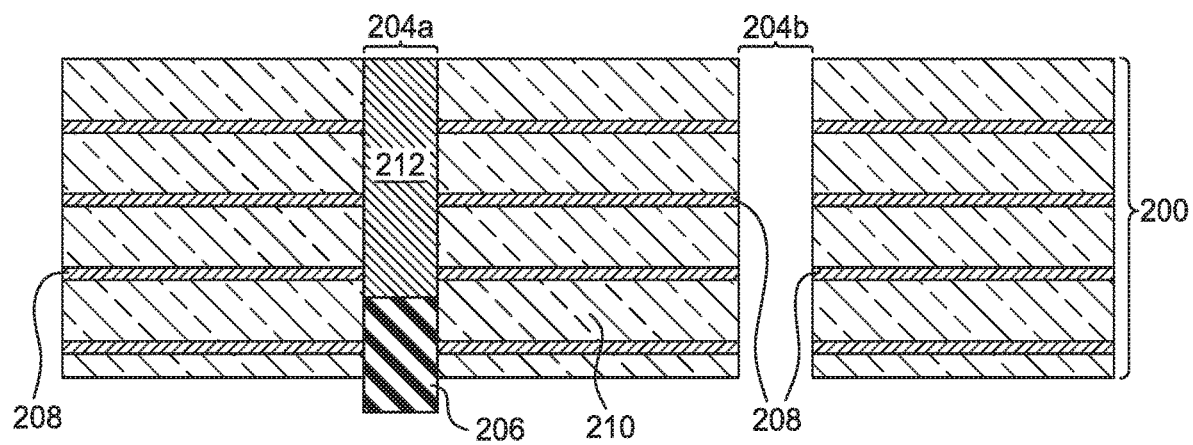

Method 100 includes sintering the metal material at operation 110. Sintering of the metal material (e.g., copper nanoparticles) is performed by techniques known in the art, such as by heating in an oven, electrical sintering, micro-wave sintering, and photonic sintering (by, for example, a flash lamp or laser). Laser sintering can be performed by using a neodymium-doped yttrium aluminum garnet (Nd:YAG) laser. The Nd:YAG laser can be continuous wave or pulsed wave. Suitable conditions for duration, temperature, speed, laser power, etc. are determined empirically. Sintering results in the metal material solidified together as a "bulk metal material" and to the exposed circuit traces along the via. Laser sintering may be performed using a continuous wave laser having a maximum power of about 2 Watts. Alternately, laser sintering of the copper nanoparticles can be performed by using a femtosecond laser pulse with duration of greater than about 100 fs, repetition rate of 80 MHz, and a wavelength of 800 nm. Sintering can be performed in multiple layers (i.e., apply nanoparticles, sinter, apply nanoparticles, sinter, and repeat until, e.g., the via is full). As shown in FIG. 2B, the bulk metal material 212 contacts the circuit traces 208, thus electrically connecting the conductive surfaces of the PCB 200.

After operation 110, the method 100 of forming the stub-less vias may end. In some embodiments, and after the sintering operation 110, the plug is removed at operation 112. The plug can be removed by automated robotic equipment or manually. The method 100 results in the formation of a stub-less via in the PCB at operation 114. Method 100 may be performed using nanocapsules instead of, or in addition to, the microcapsules.

Figure 1B:
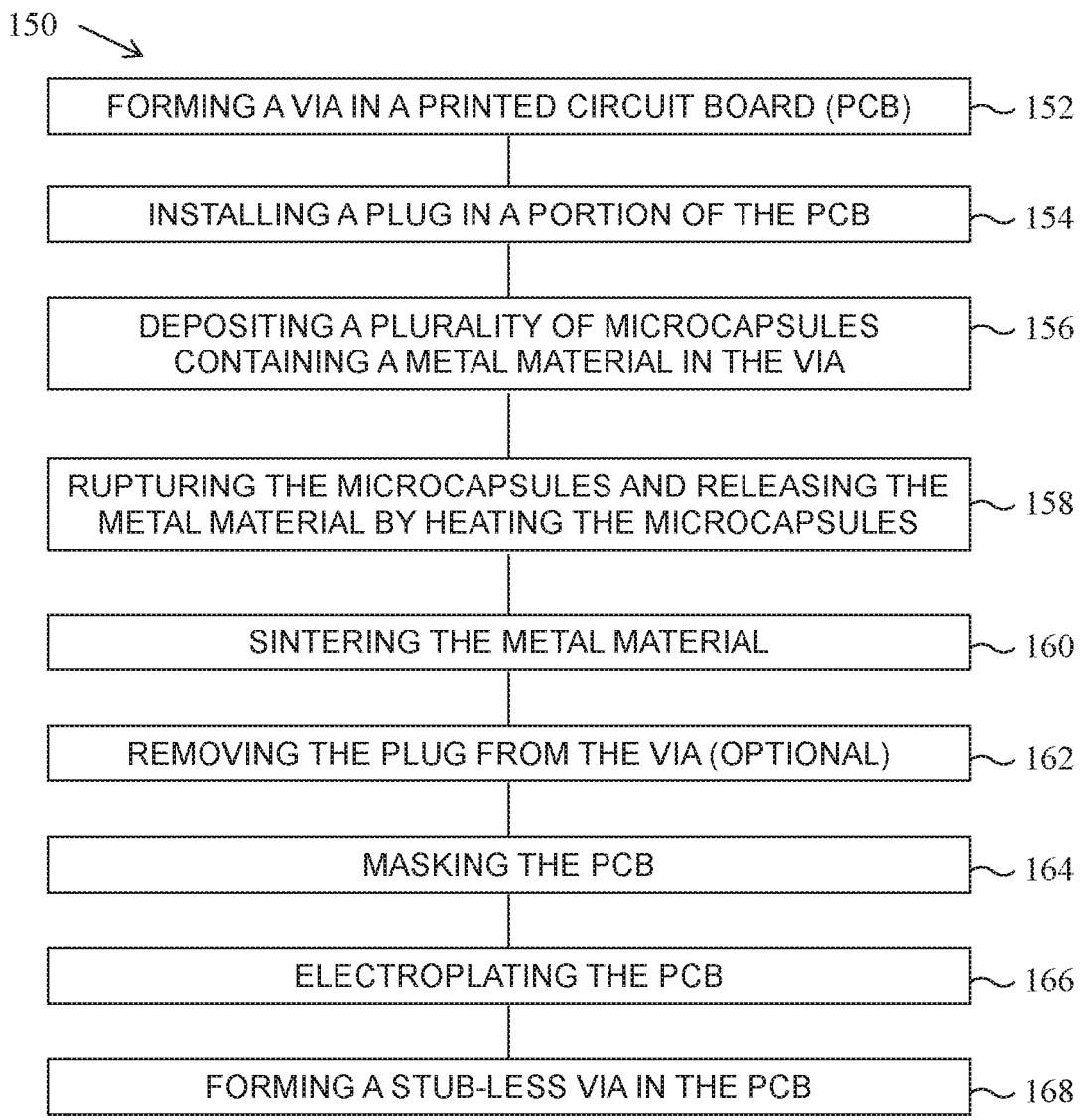
FIG. 1B is a flow diagram summarizing a method of forming a stub-less via according to some embodiments.
Figure 2C:
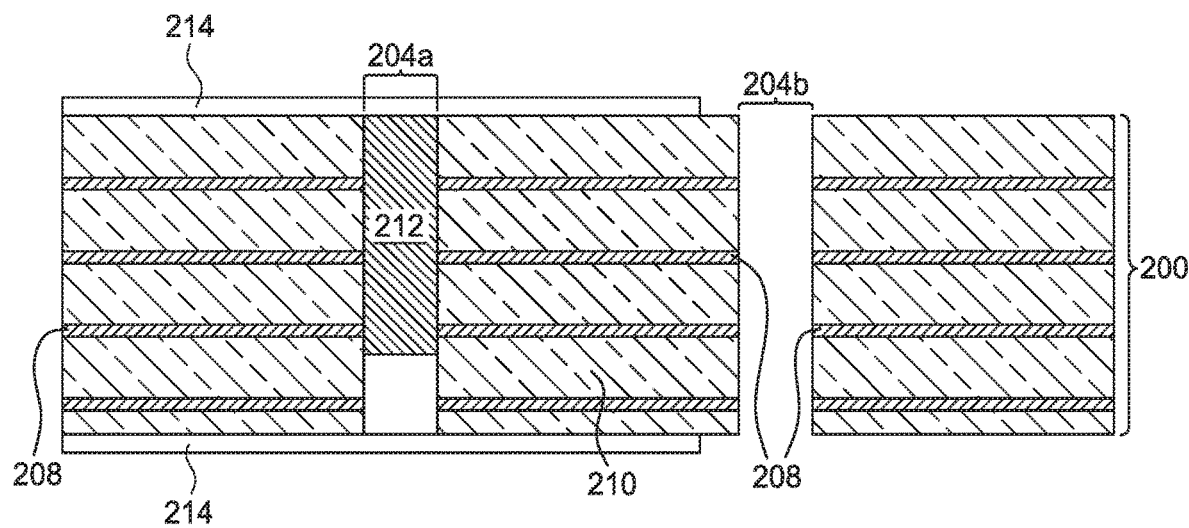
Figure 2D:
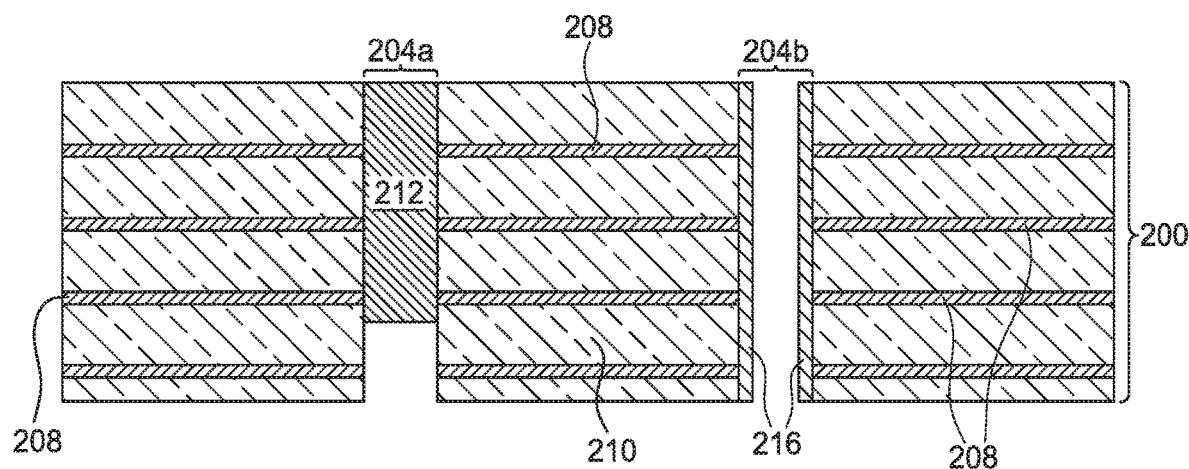

FIG. 1B is a flow diagram summarizing a method 150 of forming a stub-less via in a PCB according to some embodiments. Operations 152-160 are described above as operations 102-110, respectively, and removing the plug at operation 162 is optional. Method 150 further includes applying a mask (which may be patterned) to the PCB at operation 164. The mask allows for selective electroplating of the structures of the PCB by selectively blocking the deposition of metal so that deposition only occurs on the area(s) of the PCB left exposed. For example, and as shown in FIG. 2C, the mask 214 is patterned to cover the portion of the vias containing the sintered Cu 212. Masking may be accomplished by conventional methods in the art such as by dipping the PCB into a liquid that then dries into a solid (lacquer or rubbers). Method 150 further includes electroplating a metal such as copper onto one or more non-masked vias, e.g., areas of the PCB where a controlled depth is not required, at operation 166. Electroplating may be performed by conventional methods known in the art. For example, after the mask is applied to the PCB which exposes selected surfaces of the PCB, an electroless plate layer (e.g., a coating of copper) is chemically deposited on the exposed surfaces of the PCB, including the via walls. This electroless plate layer creates a metallic base for electroplating copper into the exposed surfaces of the PCB. Electrolytic copper is then applied to the exposed surfaces of the PCB, and forming a copper layer by adhering to a portion of the electroless plate layer. Following electroplating, the mask is removed using solvent by conventional techniques. As shown in FIG. 2D, the electroplated metal 216 is formed selectively on the via 204b of the PCB 200. In some embodiments, the plug is removed after the mask is removed. Method 150 may be performed using nanocapsules instead of, or in addition to, the microcapsules. The method 150 results in the formation of a stub-less via in a PCB at operation 168.

Figure 1C:
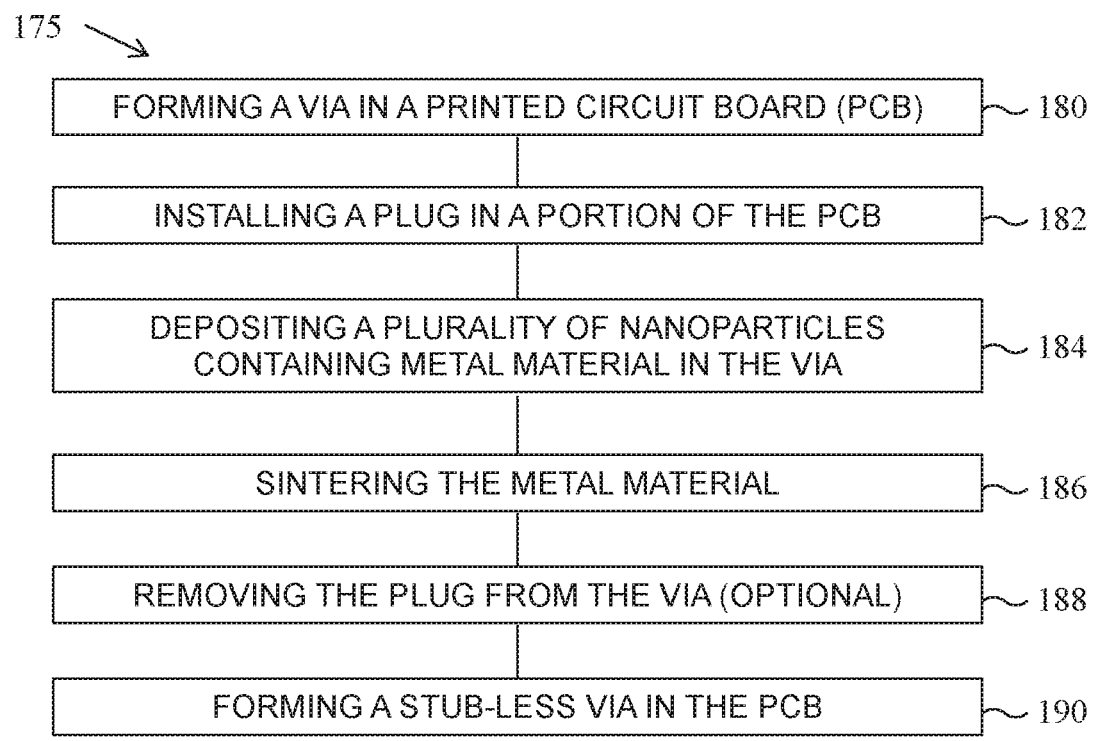
FIG. 1C is a flow diagram summarizing a method of forming a stub-less via according to some embodiments.

FIG. 1C is a flow diagram summarizing a method 175 of forming a stub-less via in a PCB according to some embodiments. Operations 180-182 and 186-188 are described above as operations 102-104 and 110-112, respectively, and removing the plug at operation 188 is optional. Method 175 further includes depositing a plurality of nanoparticles containing metal material in the via at operation 184. Examples of metal material are a copper (Cu) material and a copper alloy material. Moreover, examples of nanoparticles containing metal material include copper nanoparticles and copper alloy nanoparticles. Method 175 may further include applying a mask to the PCB and electroplating a metal such as copper onto one or more non-masked vias, as described above. Method 175 may be performed using microparticles containing metal material instead of, or in addition to, nanoparticles containing metal material. The method 175 results in the formation of a stub-less via in a PCB at operation 190.

In some embodiments, depositing a plurality of microcapsules (e.g., operation 106), rupturing said microcapsules by heating the microcapsules (e.g., operation 108), and depositing a plurality of nanoparticles containing metal material (e.g., operation 190) may be performed for a via.

FIGS. 2A-2D show schematic illustrations of forming a stub-less via according to some embodiments. FIG. 2A depicts a PCB 200 formed of dielectric layers 210 (e.g., substrate) and conductive layers 208 (e.g., circuit traces). Vias 204a and 204b are formed in the PCB 200 by operation 102 which exposes one or more internal structures such as the circuit traces 208 of the PCB 200. A plug 206 is located (installed at operation 104) in those vias requiring a controlled depth, i.e., via 204a. Microcapsules 202 are deposited in the via 204a by using, for example, a nozzle, at operation 106. Although not shown, nanoparticles containing metal material can be deposited in the via 204a in a similar fashion.

FIG. 2B illustrates embodiments of the PCB 200 after the sintering operation 110, where the metal material (e.g., Cu nanoparticles) is solidified together as a bulk metal material 212 and to the circuit traces 208. The bulk metal material 212 contacts the circuit traces 208, thus electrically connecting the conductive surfaces of the PCB 200.

FIG. 2C illustrates embodiments after masking the PCB 200 with a patterned mask 214. The patterned mask 214 covers selected portions of the PCB 200, for example, the via 204a containing the sintered bulk metal material 212, leaving the via 204b exposed. FIG. 2C also shows that the plug 206 has been removed from the PCB 200. FIG. 2D illustrates embodiments after electroplating the PCB 200. The electroplated metal 216 (e.g., electroplated Cu) is deposited in the via 204b and contacts the circuit traces 208.

The benefits of using the methods described herein are to reduce or eliminate via stub formation in the vias of PCBs, decreased production costs associated with the manufacture of PCBs, and increased signal integrity of the digital signals passing through the vias of PCBs. If conventional methods were used in the formation of the via, a via stub would have formed that would significantly distort signals that pass through the via. The via stub would then have to be removed or reduced by conventional means such as backdrilling, or by use of micro via or build up layer processing techniques. Backdrilling, however is a costly, time-consuming process that uses controlled depth drilling techniques to remove the via stub (e.g., remove conductive plating in a via stub region). Moreover, improper backdrilling introduces defects into the PCBs, such as by removing more of the plated through holes than necessary or by being off-center of the plated through hole. Additionally, micro via and/or build up layer processing techniques add numerous processing steps to form short vias. The addition of processing steps can cause significant yield impact, resulting in large cost increases. Thus, the construction of a PCB by depositing microcapsules in a PCB via, rupturing the microcapsules containing a metal material, and subsequent sintering of the metal material, reduces (or eliminates) the formation of a via stub, is an alternative to the conventional methods.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing is directed to embodiments of the present disclosure, other and further embodiments of the disclosure may be devised without departing from the basic scope thereof, and the scope thereof is determined by the claims that follow.

What is claimed is:

1. A method of forming a stub-less via, comprising:
    depositing a plurality of microcapsules containing a metal material in a via of a printed circuit board (PCB);
    rupturing the microcapsules and releasing the metal material; and
    sintering the released metal material.

2. The method of claim 1, further comprising:
    installing a plug in a portion of the via prior to depositing the plurality of microcapsules; and
    removing the plug from the via after sintering the released metal material.

3. The method of claim 1, further comprising:
    masking the PCB with a patterned mask after sintering the released metal material; and
    electroplating a non-masked via after masking the PCB.

4. The method of claim 1, wherein the metal material comprises a copper material, a copper alloy material, or a combination thereof.

5. The method of claim 1, wherein the metal material comprises a copper material.

6. The method of claim 1, wherein rupturing includes heating the microcapsules.

7. The method of claim 6, wherein the microcapsules are heated at a temperature of or temperature range of from 60° C. to 300° C.

8. The method of claim 1, wherein a shell wall of the microcapsules comprises one or more of gelatin, arabic gum, shellac, lac, starch, dextrin, wax, rosin, sodium alginate, zein, methyl cellulose, ethyl cellulose, carboxymethyl cellulose, hydroxyethyl ethyl cellulose, polyolefins, polystyrenes, polyethers, polyesters, polyureas, polyethylene glycol, polyamides, polyimides, urea-formaldehydes, polyurethane, polyacrylate, epoxy resins, and combinations thereof.

9. The method of claim 1, wherein a shell wall of the microcapsules comprises one or more of a melamine-formaldehyde, N-isopropylacrylamide (N-IPAAm), poly-ε-caprolactone, and poly lactic acid.

10. A method of forming a stub-less via, comprising:
    forming a via in a printed circuit board (PCB);
    installing a plug in a portion of the via;
    depositing in the via a plurality of microcapsules containing a metal material;
    rupturing the microcapsules and releasing the metal material;
    sintering the released metal material;
    masking the PCB with a patterned mask; and
    electroplating a non-masked via.

11. The method of claim 10, wherein the metal material comprises a copper material, a copper alloy material, or a combination thereof.

12. The method of claim 10, wherein the metal material comprises a copper material.

13. The method of claim 10, wherein rupturing includes heating the microcapsules.

14. The method of claim 13, wherein the microcapsules are heated at a temperature of or temperature range of from 60° C. to 300° C.

15. The method of claim 10, wherein a shell wall of the microcapsules comprises one or more of gelatin, arabic gum, shellac, lac, starch, dextrin, wax, rosin, sodium alginate, zein, methyl cellulose, ethyl cellulose, carboxymethyl cellulose, hydroxyethyl ethyl cellulose, polyolefins, polystyrenes, polyethers, polyesters, polyureas, polyethylene glycol, polyamides, polyimides, urea-formaldehydes, polyurethane, polyacrylate, epoxy resins, and combinations thereof.

16. The method of claim 10, wherein a shell wall of the microcapsules comprises one or more of a melamine-formaldehyde, N-isopropylacrylamide (N-IPAAm), poly-ε-caprolactone, and poly lactic acid.

* * * * *